United States Patent
Choi et al.

(10) Patent No.: US 10,139,717 B2
(45) Date of Patent: Nov. 27, 2018

(54) LASER-DIODE, LIQUID-CRYSTAL PROJECTOR

(71) Applicant: CREMOTECH CO., LTD., Seongnam-si, Gyeonggi-do (KR)

(72) Inventors: Hyun Rak Choi, Seoul (KR); Hyuk Ryeol Kwon, Seoul (KR); Sung Taek Kwon, Yongin-si (KR)

(73) Assignee: CREMOTECH CO., LTD., Seongnam-si (KR)

( * ) Notice: Subject to any disclaimer, the term of this patent is extended or adjusted under 35 U.S.C. 154(b) by 0 days.

(21) Appl. No.: 15/550,791

(22) PCT Filed: Feb. 15, 2016

(86) PCT No.: PCT/KR2016/001473
§ 371 (c)(1),
(2) Date: Aug. 13, 2017

(87) PCT Pub. No.: WO2016/129969
PCT Pub. Date: Aug. 18, 2016

(65) Prior Publication Data
US 2018/0024428 A1   Jan. 25, 2018

(30) Foreign Application Priority Data
Feb. 13, 2015   (KR) .................. 10-2015-0021996

(51) Int. Cl.
*G03B 21/20* (2006.01)
*H01S 5/022* (2006.01)
*G02B 9/60* (2006.01)
*G02B 13/16* (2006.01)
*G02B 13/18* (2006.01)
(Continued)

(52) U.S. Cl.
CPC .......... *G03B 21/2073* (2013.01); *G02B 9/60* (2013.01); *G02B 13/16* (2013.01); *G02B 13/18* (2013.01);
(Continued)

(58) Field of Classification Search
CPC .... G03B 21/28; G03B 21/206; G03B 21/208; G03B 21/2013; G03B 21/2033;
(Continued)

(56) References Cited

U.S. PATENT DOCUMENTS

| 8,801,189 B2 | 8/2014 | Mizushima et al. |
| 2006/0126022 A1* | 6/2006 | Govorkov ............ G02B 26/101 353/31 |

(Continued)

FOREIGN PATENT DOCUMENTS

| JP | 2011-510357 A | 3/2011 |
| KR | 10-2011-0088104 A | 8/2011 |

(Continued)

OTHER PUBLICATIONS

KR Notification of Reason for Refusal dated Jun. 30, 2015 as received in Application No. 10-2015-0021996 (English Translation).

(Continued)

*Primary Examiner* — Sultan Chowdhury
(74) *Attorney, Agent, or Firm* — Maschoff Brennan

(57) ABSTRACT

The present invention relates to a laser-diode, liquid-crystal projector. In the present invention, a light source comprises a G laser diode emitting green light, a B laser diode emitting blue light, and an R laser diode emitting red light and provided such that a power application pin is positioned vertical to the power application pin of the G laser diode or B laser diode, and an optical structure appropriate therefor is proposed. According to the present invention, the directions of polarized lights of the R, G, and G light sources incident from an optical modulator formed from a liquid crystal can be consistent with each other by efficiently changing the arrangement of the pins of the laser diodes without using a separate complex optical element.

14 Claims, 11 Drawing Sheets

(51) Int. Cl.
  *G02B 27/48* (2006.01)
  *G03B 21/00* (2006.01)
  *G02B 27/10* (2006.01)
  *G03B 33/06* (2006.01)
(52) U.S. Cl.
  CPC ..... *G02B 27/1033* (2013.01); *G02B 27/1053* (2013.01); *G02B 27/48* (2013.01); *G03B 21/006* (2013.01); *G03B 21/208* (2013.01); *G03B 21/2033* (2013.01); *G03B 33/06* (2013.01); *H01S 5/022* (2013.01)
(58) Field of Classification Search
  CPC ...... H04N 9/315; H04N 9/317; H04N 9/3152; H04N 9/3155; H04N 9/3161; H04N 9/3164; H04N 9/3167
  See application file for complete search history.

(56) References Cited

U.S. PATENT DOCUMENTS

| | | | |
|---|---|---|---|
| 2009/0185141 A1 | 7/2009 | Chen et al. | |
| 2010/0085631 A1* | 4/2010 | Kusukame | G02F 1/3525 359/328 |
| 2010/0329671 A1* | 12/2010 | Essiambre | G02B 6/14 398/44 |
| 2012/0099086 A1 | 4/2012 | Chuang | |
| 2013/0050285 A1* | 2/2013 | Takahashi | G02B 27/48 345/690 |
| 2013/0335813 A1* | 12/2013 | Furuya | G02B 27/01 359/328 |
| 2015/0124227 A1* | 5/2015 | Kobayashi | G03B 21/2033 353/38 |
| 2016/0033757 A1* | 2/2016 | Kurtz | H04N 5/7458 359/292 |

FOREIGN PATENT DOCUMENTS

KR 10-2014-0092524 A 7/2014
WO 2011/161931 A1 12/2011

OTHER PUBLICATIONS

KR Grant of Patent dated Jan. 8, 2016 as received in Application No. 10-2015-0021996 (English Translation).

\* cited by examiner (a)

(b)

(c)

(a)  (b)

LASER-DIODE, LIQUID-CRYSTAL PROJECTOR

TECHNICAL FIELD

The present invention relates to a laser-diode, liquid-crystal projector, and more particularly, to a laser-diode, liquid-crystal projector having an optimized optical structure for reducing speckles appearing in an image produced by arrangement of laser diodes when a projector is configured using an optical modulator composed of liquid crystals.

BACKGROUND ART

In order to develop portable small-scale projectors smaller than a palm size or to commercialize a projector that is small enough to be embedded in a notebook or the like, a projector having a small size and low power consumption should be developed. In order to achieve a small-scale and low-power projector, a small-scale light source with excellent power consumption should be. The most suitable light source for such a low power projector is a laser light source or an electroluminescent device (LED).

LED light sources and laser light sources are known as efficient light sources that emit high intensity light at low power. However, both devices have disadvantages. The LED light source has a disadvantage in that it has a lower light efficiency than the laser as a light source having a high etendue. In contrast, the laser light source exhibits higher luminous efficacy than the LED, but has a disadvantage in that the laser has a unique interference pattern called speckle. Therefore, if the speckle effect of the laser light can be reduced, there may be no small light source more suitable for a micro-projector than the laser light source.

FIG. 1 shows the structure of a projector using a conventional laser light source implemented with a reflective optical modulator. The projector using the conventional laser light source includes a laser light source composed of an R light source 10R, a G light source 10G and a B light source 10B, a dichroic mirror 50 composed of 50R, 50G and 50B, reflectors 51 and 53, a diffuser 20, a beam shaper 30, a field lens 40, an optical modulator 60, a projection lens 70, and a polarized beam splitter 80.

The laser light source preferably sequentially emits R/G/B light. Sequentially emitting light from the laser R, G and B light sources 10R, 10G and 10B means that, when the total time needed to emit a whole frame is T, the R light source emits light for T/3, the G light source emits light for the subsequent T/3, and the G light source emits light for the next T/3.

Since a light source for a micro-projector is required to have a small size and a high light output power, a laser light source or an electroluminescent device (LED) is a suitable light source. At least one laser light source from among the three light sources 10R, 10G, and 10B should be included. Preferably, all three laser light sources are used, or a hybrid type light source is configured using laser and LED light sources, if necessary. Light emitted from the three light sources is reflected by or transmitted through respective dichroic mirrors 50R, 50G, and 50B, and is incident on the diffuser 20. The dichroic mirror 50G functions to reflect light emitted from the G light source 10G (green laser light) and allow light from the other light sources to be transmitted therethrough. As the dichroic mirror 50G, a typical mirror that reflects all visible wavelengths can be employed. The dichroic mirror 50R functions to reflect light emitted from the R light source 10R (red laser light) and allow light of other wavelengths to be transmitted therethrough. The dichroic mirror 50B functions to emit light from the B light source 10B (blue laser light) and allow light in the other wavelength range to be transmitted therethrough.

The laser light emitted from the laser light sources 10R, 10G, and 10B is reflected by the reflectors 51 and 53, and then is incident on the diffuser 20. The diffuser vibrates perpendicular to the optical axis, and thus randomness of light increases as the light passes through the diffuser. The diffuser, which is a device for removing speckles unique to a laser beam, lowers coherence of the laser beam to reduce speckles. Vibrating the diffuser 20 may further reduce the speckles.

The beam shape of the light passing through the diffuser 20 is deformed by the beam shaper 30. Deforming the beam shape is intended to form a beam shape that is suitable for the shape of the surface of incidence of the optical modulator 60 to improve luminous efficacy.

A typical example of the beam shaper 30 may be a fly-eye lens. The fly-eye lens is implemented using a plurality of small lens bodies. The small lens bodies implemented in the fly-eye lens may have various shapes. For example, they may have a rectangular convex shape, a hexagonal convex shape, a circular shape, or the like, but preferably have the same shape as that of the optical modulator (more specifically, the effective screen shape of the optical modulator). For example, if the effective screen shape of the optical modulator is rectangular, the small lens bodies may be formed in a rectangular shape, thereby minimizing optical loss.

In the embodiment of FIG. 1, a double-sided fly-eye lens having small lens bodies on both sides thereof is used as the beam shaper 30. However, two single-sided fly-eye lenses may be used. The multiple small lens bodies formed on both sides or on two lenses have a one-to-one correspondence relationship with each other.

The field lens 40 serves to focus the light shaped by the beam shaper 30 onto the optical modulator 60. The field lens 40 is generally comprised of one to three lenses and accurate focusing may be achieved by adjusting the distance between these lenses and the beam shaper 30.

The optical modulator 60 refers to a device that selectively transmits or blocks incident light or changes an optical path to generate an image. Typical examples of the optical modulator 60 may include a digital micromirror device (DMD), a liquid crystal display device (LCD) and an LCOS. The DMD is a device used in a DLP projector using as many digital mirrors arranged in a matrix form as the pixels based on field sequential. The DLP is a projector that implements gradation and an image by reflecting light emitted from a light source onto a screen by adjusting a light path according to a digital mirror. The LCD is a device that selectively turns on/off liquid crystals to generate an image. Projectors using the LCD include a direct type projector, a projection type projector, and a reflective projector. The direct type projector causes light from the backlight behind the LCD to pass through the liquid crystal panel such that a generated image is directly viewed. The projection type projector enlarges an image generated when light passes through the LCD by using a projection lens and then projects the enlarged image onto a screen such that the image reflected onto the screen is viewed. The reflective projector has almost the same structure as the projection type projector, except that a reflective film is formed on a lower substrate such that light is reflected and projected onto the screen with the image enlarged. LCoS (Liquid Crystal on Silicon) is a reflective liquid crystal display, which is a reflective optical device that operates using a silicon substrate employed in place of transparent glass, which is conventionally used as the lower substrate of the two substrates of an LCD.

In the embodiment of FIG. 1, the polarized beam splitter 80, which is a reflective optical system, serves to transmit an image generated by the optical modulator 60 to the projection lens 70. The polarized beam splitter (PBS) 80, which has a polarization splitting film diagonally arranged in a hexahedral body formed of glass, is an essential optical device for a reflective optical engine.

The polarized beam splitter 80 is an optical device that uses a polarization splitting film to allow P-polarized light to pass therethrough and reflect S-polarized light in a direction opposite to the projection lens. Alternatively, the polarized beam splitter may be configured to pass S-polarized light and to reflect P-polarized light, if necessary. In FIG. 1, for simplicity, the polarized beam splitter is illustrated as passing P-polarized light and reflecting S-polarized light. Therefore, to maintain luminous efficacy, the light emitted from the laser light source 10 should be converted into a linearly polarized state at a certain point on the optical path.

The P-polarized light passed through the polarization splitting film of the polarized beam splitter 80 is converted into S-polarized light in the process of forming an image through the reflective optical modulator 60, and the image light converted into the S-polarized light is again incident on the polarized beam splitter 80 and reaches the polarization splitting film. Since the image light is S polarized light at this time, the entire image light is reflected on the polarization splitting film and is incident on the projection lens 70. The projection lens 70 is configured using multiple lenses, and serves to enlarge and project an image formed by the optical modulator 60 onto a screen (not shown). A projector using the conventional laser light source shown in FIG. 1 has high luminous efficacy and a wide color range, but it generates an interference pattern known as speckle in the enlarged projection image. This projector cannot be used as a high-quality projector.

DISCLOSURE

Technical Problem

Therefore, the present invention has been made in view of the above problems, and it is one object of the present invention to provide an optimum array of laser diodes capable of aligning the polarization directions of light incident on the optical modulator when the optical modulator is configured with transmissive liquid crystals or reflective liquid crystals and to provide a laser-diode, liquid-crystal projector capable of minimizing power consumption.

Technical Solution

In accordance with one aspect of the present invention, provided is a laser-diode, liquid-crystal projector using a laser diode as a light source and a liquid crystal element as an optical modulator, wherein the light source includes: a G laser diode for emitting green light of an elliptical shape elongated in a first direction; a B laser diode for emitting blue light of an elliptical shape elongated in the first direction, an R laser diode for emitting red light of an elliptical shape elongated in a direction perpendicular to the first direction, the R laser diode being disposed such that a power application pin thereof is arranged perpendicular to an installation direction of a power application pin of the G laser diode or the B laser diode, the laser-diode, liquid-crystal projector including: a first beam shaper for transforming light emitted from the light source in a perpendicularly intersecting pattern into uniform light; a second beam shaper for forming the light emitted from first beam shaper into a shape of an effective surface of the optical modulator; a field lens for condensing the light formed by the second beam shaper; a polarized beam splitter for reflecting the light incident from the field lens to the optical modulator and allowing light incident from the optical modulator to be transmitted therethrough; and a projection lens for enlarging and projecting an image generated from the optical modulator, wherein the G laser diode, the B laser diode, and the R laser diode are intrinsic multimode laser diodes, wherein light rays emitted from the G laser diode, the B laser diode, and the R laser diode configured to form light in a perpendicularly crossing shape have the same polarization axis.

Advantageous Effects

A laser-diode, liquid-crystal projector according to the present invention may efficiently change the pin arrangement of the laser diodes without a separate, complex optical device, thereby aligning the polarization directions of the R, G, and B light rays incident on the optical modulator configured using liquid crystals.

In addition, by efficiently vibrating the second beam shaper, the speckles may be efficiently reduced with a simpler structure than the conventional technology for reducing speckles. By optimizing the configuration of a projection lens, a clear image may be projected onto the screen.

Figure 1:
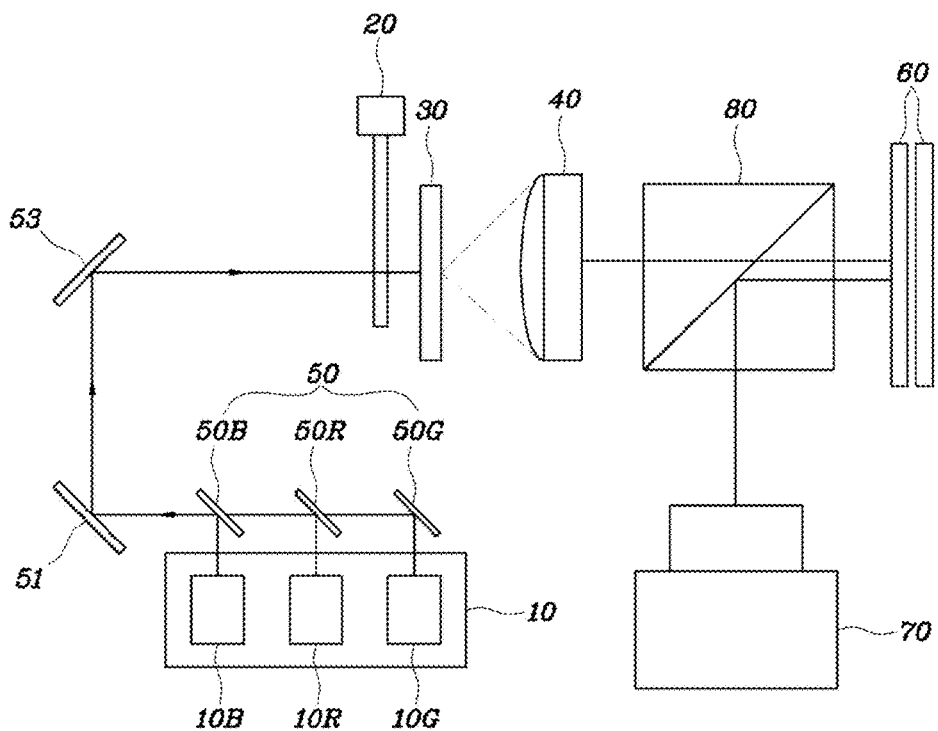
FIG. 1 is a structural view of a conventional projector using a laser light source implemented with a reflective optical modulator.

| Reference Numerals | |
|---|---|
| 10: Laser light source | 10R: R light source |
| 10G: G light source | 10B: B light source |
| 11: Cooling pin | 13: Lens barrel |
| 10RJ: R laser diode power application pin | |
| 10GJ: G laser diode power application pin | |
| 10BJ: B laser diode power application pin | |
| 20: Diffuser | 30: Beam shaper |
| 31: First beam shaper | 33: Second beam shaper |
| 35: Gap space | 37: Small lens body |
| 40: Field lens | 41: First field lens |
| 43: Second field lens | 50, 50R, 50G, 50B: Dichroic mirror |
| 51, 53: Reflector | 57: Forceps |
| 55: Oscillator | 60: Optical modulator |
| 60a: Projection type liquid crystal light modulator | 70: Projection lens |
| 80: Polarized beam splitter | 85: X-Cube |

BEST MODE

While the invention is susceptible to various modifications and alternative forms, specific embodiments thereof are shown by way of example in the drawings and will herein be described in detail.

It should be understood that the invention is not intended to be limited to specific embodiments, but includes all modifications, equivalents, and alternatives within the spirit and scope of the invention.

Among the problems in manufacturing a projector using laser diodes, problems that were not known in the past but were discovered by the present inventor will be described first. The present invention employs a technique of sequentially emitting R laser light, G laser light, and B laser light in a time division manner as described in the related art. Therefore, when compared with a projector that does not use the time division emission technique, the time to emit light per laser light source is reduced, and a high power laser light source needs to be used. More specifically, a laser diode with a peak power consumption of at least 1 watt (commonly referred to as a "watt class laser diode") should be used to provide a projector exhibiting sufficient luminance. However, with current technology, intrinsic laser diodes produced in a multimode are to be used as watt class laser diodes. That is, with a laser diode produced in a single mode or a laser diode produced by pumping means, a watt class laser diode cannot be manufactured.

A laser resonator has a myriad of resonance frequencies. In a general gain medium, all modes included in the gain width can oscillate. In order to manufacture a laser diode having a high output power, oscillation of various modes exceeding a gain threshold needs to be used, and therefore the laser diode should be a multimode laser diode.

Intrinsic multimode laser diodes generally depend on the properties of a material implementing the corresponding color. The G laser diode and the B laser diode have similar characteristics, but the R laser diode has completely different characteristics. One of the most distinctive features is that light from each color laser diode is output in a manner that the light is orthogonal to only one of the waveforms of the electromagnetic wave. In the case of a single-mode laser diode, light can be controlled to be output in an ideal wavelength form perpendicular to both the electric wave and the magnetic wave due to a Transverse to Electric and Magnetic (TEM) characteristic. On the other hand, to increase the output power of a multimode laser diode to more than the watt class, it can be manufactured only by TM (Transverse to Magnetic) or TE (Transverse to Electric) to have a waveform perpendicular only to either the magnetic wave or the electric wave, which is not ideal. More precisely, intrinsic multimode R laser diodes with watt class output power have TE characteristics and thus produce an S-polarized waveform, while intrinsic G laser diodes and intrinsic B laser diodes produced in the multimode with watt class output power have TM characteristics and thus produce a P-polarized waveform.

However, in the laser-diode, liquid-crystal projector according to the present invention, liquid crystals are used for the optical modulator, and the light rays output from the laser diodes of all colors must be adjusted before reaching the liquid crystal optical modulator such that their polarization axes are aligned. Hereinafter, an optical modulator implemented with a liquid crystal device will be referred to as a "liquid crystal optical modulator", and a projector employing the liquid crystal optical modulator will be referred to as a "liquid crystal projector". In order to solve the aforementioned problem, a phase difference plate as an optical material for converting the S polarization axis into the P polarization axis may be placed on the front surface of the R laser diode. Unfortunately, the watt class laser diode produces an excessively strong output power, which causes the phase difference plate to be plasticized and lose characteristics thereof. As a result, a phase difference plate that is usable cannot be obtained with current technology. In order to solve this problem, the present invention proposes that the R laser diode be installed in the lens barrel at 90° with respect to the G laser diode and the B laser diode such that the power application pin thereof is arranged perpendicular to the other light sources.

Figure 2:
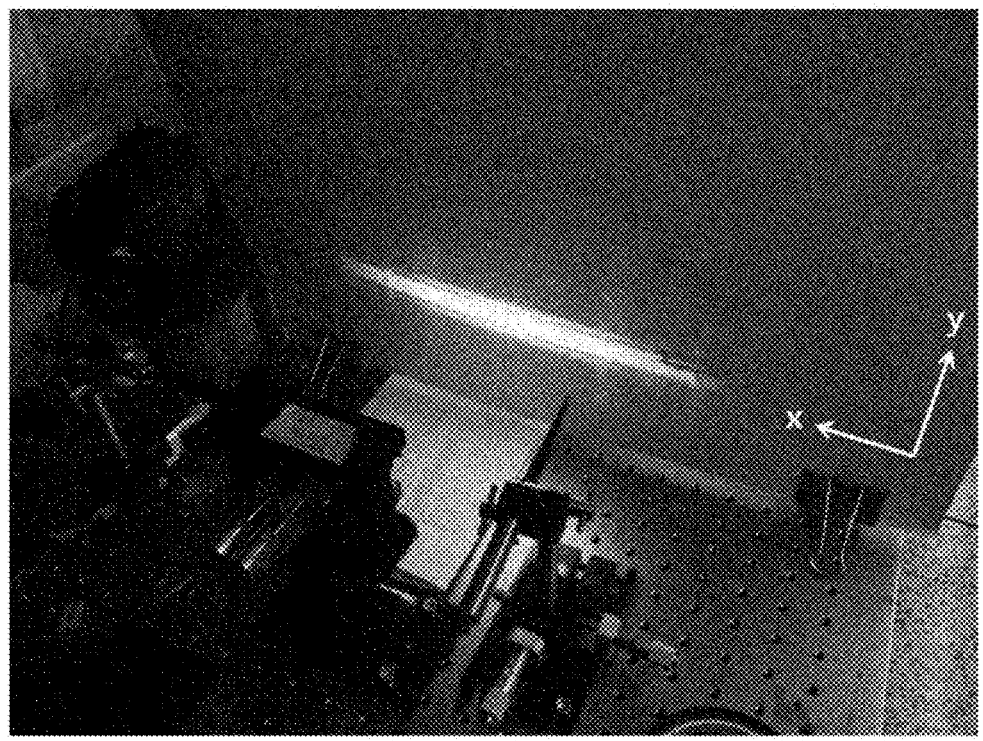
FIG. 2 is a photograph showing a source of light emitted onto a screen with a G laser diode installed in a lens barrel.
Figure 3:
FIG. 3 is a photograph showing a source of light emitted onto a screen with a B laser diode installed in a lens barrel.
Figure 4:
FIG. 4 is a photograph showing a source of light emitted on a screen by installing an R laser diode at 90° with respect to the other light sources in the lens barrel and thus arranging a corresponding power application pin rotated by 90°.

When the power application pin arrangement is changed, a new phenomenon appears, which will be described with reference to the drawings. Light output from a multimode intrinsic laser diode with power greater than the watt class has a shape that is elongated in one direction. FIGS. 2, 3 and 4 show the shapes of light emitted from the light sources of a G laser and a B laser diode and an R laser diode in a case where the R laser diode, the G laser diode and the B laser diode are installed in a lens barrel such that the G laser and the B laser diode are oriented in the same direction and the R laser diode is rotated by 90° with respect to the G laser and the B laser diode in order to align the polarization axes. As shown in FIGS. 2 and 3, it can be seen that the G laser diode and the B laser diode emit light in a shape approximately elongated in the horizontal direction, while the R laser diode emits light in a waveform approximately elongated in the vertical direction. In FIGS. 2 to 4, the coordinates correspond to the installation direction of the screen, wherein the x-axis indicates the width direction of the screen, and the y-direction indicates the height direction of the screen.

Therefore, in manufacturing a projector using multimode intrinsic laser diodes that output a watt class or higher output power, if a laser diode corresponding to a certain color is rotated by 90° with respect to the other light sources, the corresponding power application pin is arranged rotated by 90° and the beams that are projected on the screen are displayed to have a cross shape. Accordingly, a separate optical device to align the beams is required.

Figure 5:
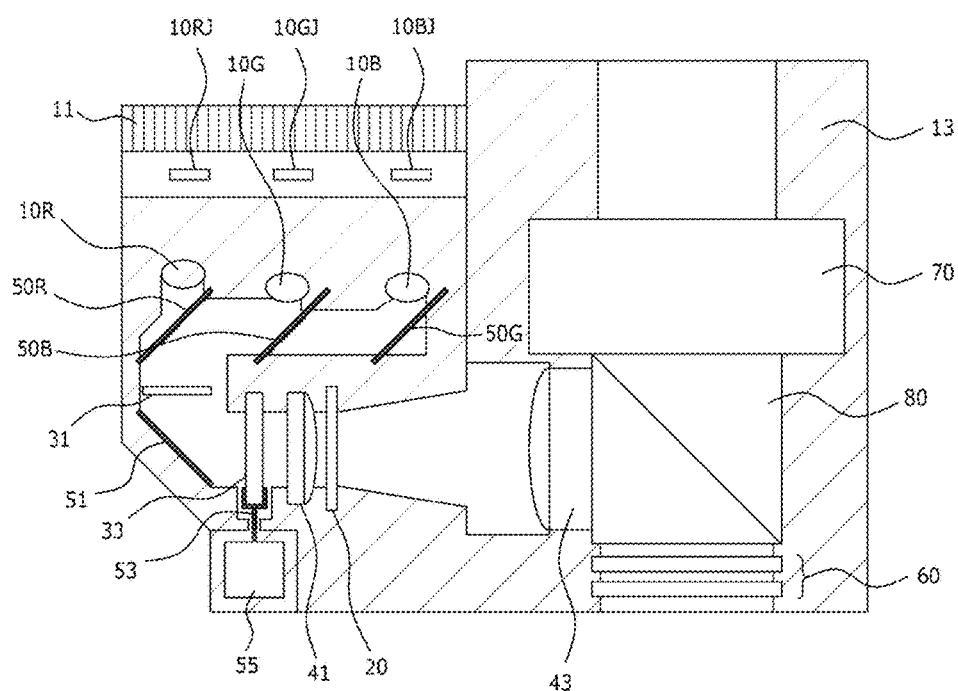
FIG. 5 is a structural view of a projector using a laser light source implemented with a reflective optical modulator according to an embodiment of the present invention.

FIG. 5 is a block diagram of a laser-diode, liquid-crystal projector according to an embodiment of the present invention. The projector using laser light sources according to the present invention includes watt class multimode intrinsic laser diodes composed of an R light source 10R, a G light source 10G, and a B light source 10B, and dichroic mirrors 50R, 50G and 50B, a reflector 51, a first beam shaper 31, a second beam shaper 33, a first field lens 41, a diffuser 20, a second field lens 43, an optical modulator 60, a projection lens 70, and a polarized beam splitter 80. Since the laser diodes 10R, 10G and 10B generate considerable heat, heat dissipation fins 11 are installed for smooth cooling. The power application pins 10RJ, 10GJ and 10BJ receive drive power through a flexible printed circuit board (FPCB).

Figure 6:
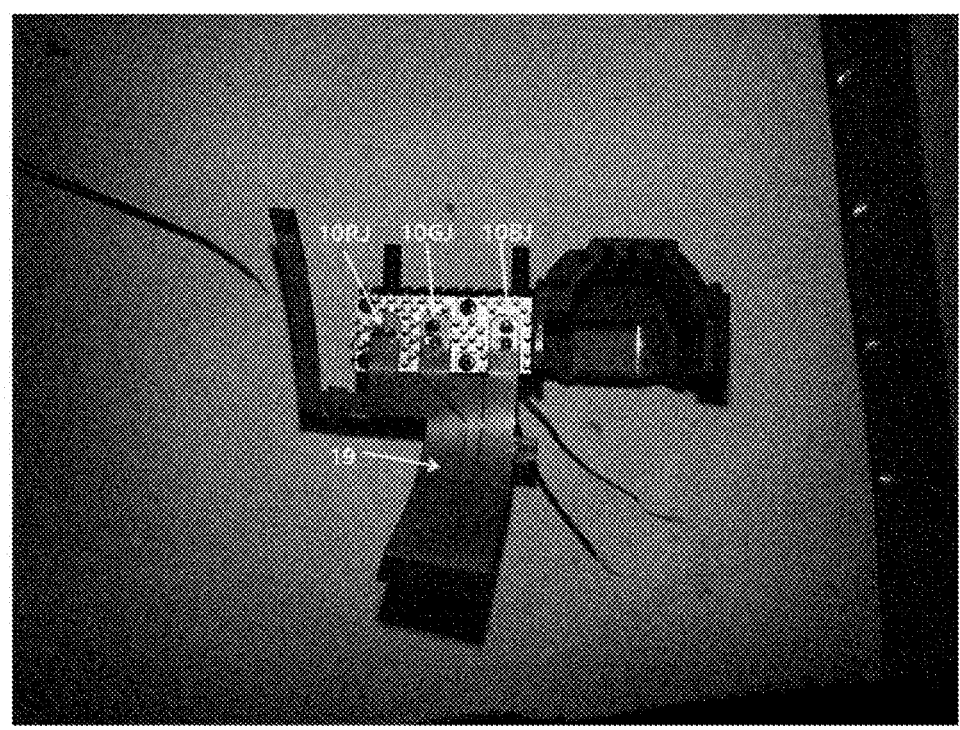
FIG. 6 is a plan view of a laser diode projector having a PBS according to the present invention, seen from the upper side.

FIG. 6 is a plan view of a laser diode projector according to the present invention, seen from the upper side. As shown in FIG. 6, the power application pin 10RJ of the R laser diode 10R is arranged rotated 90° with respect to the arrangement direction of the power application pin 10GJ of the G laser diode 10G and the power application pin 10BJ of the B laser diode 10B, and each laser diode is supplied with power through the FPCB 19.

Preferably, the watt class multimode intrinsic laser diodes sequentially emit R/G/B light. Sequentially emitting R/G/B light from the laser diode sources 10R, 10G and 10B means that, when the total time needed to emit a whole frame is T, the R light source emits light for T/3, the G light source emits light for the subsequent T/3, and the G light source emits light for the next T/3. Each light source substantially emits light for a time shorter than T/3.

Since light sources for a micro projector are required to have a small size and a high light output power, it is implemented with watt class multimode intrinsic laser diodes. As described above, the R laser diode among the three light sources is arranged rotated by 90° with respect to the other light sources to align the S polarization directions and thus the power application pin thereof is also arranged rotated by 90°. Light emitted from the three light sources is reflected by or transmitted through the respective dichroic mirrors 50R, 50G, and 50B, and is incident on the first beam shaper 31. The dichroic mirror 50B functions to reflect light from the B light source 10B (blue laser light) and allow light from the other light sources to be transmitted therethrough. A typical mirror that reflects all the light rays falling in the visible spectrum can be used in place of the dichroic mirror 50B in consideration of the installation position. The dichroic mirror 50G functions to reflect light emitted from the G light source 10G (green laser light) and allow light of other wavelengths to be transmitted therethrough. The dichroic mirror 50R functions to reflect light emitted from the R light source 10R (red laser light) and allow light of other wavelengths to be transmitted therethrough.

Figure 7:
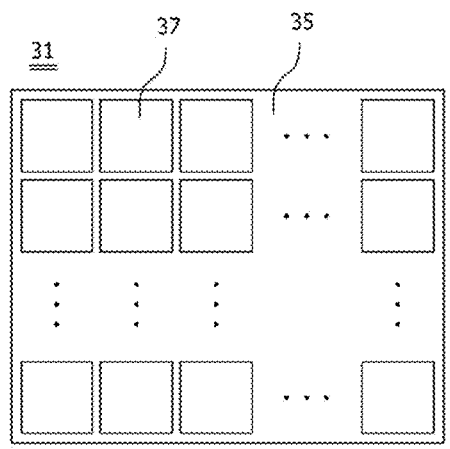
FIG. 7 is an exemplary diagram of a first beam shaper according to an embodiment of the present invention.
Figure 7:
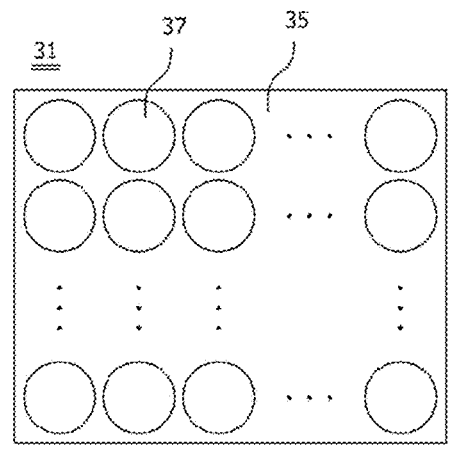
Figure 7:
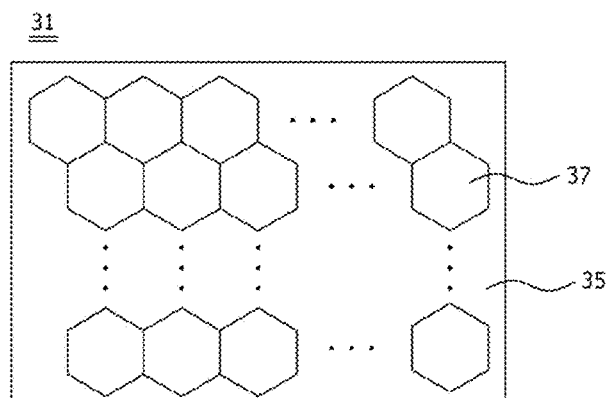

The laser beams emitted from the laser diodes 10R, 10G, and 10B are reflected by the dichroic mirrors and are then incident on the first beam shaper 31. As shown in FIGS. 2 to 4, the first beam shaper 31 is a component for forming a beam shape such that the light emitted onto the screen in an intersecting manner is as close to circular light as possible. The first beam shaper 31 may be a fly-eye lens, and FIG. 7 is an exemplary diagram illustrating various shapes of small lens bodies constituting a fly-eye lens when the fly-eye lens is used as the first beam shaper according to the present invention. The most preferred small lens body 37 of the fly-eye lens constituting the first beam shaper 31 is formed in a regular octagonal shape (honeycomb shape) as shown in FIG. 7(c).

The small lenses formed in a circular shape may be most preferable to form a beam shape close to a circle. However, when the small lens bodies 37 are formed in a circular shape as shown in FIG. 7(b), as a lens cannot be formed between the small lenses 37, a gap space 35 is generated, which degrades beam forming efficiency. When the small lenses are formed in a regular octagonal shape, all the incident light beams can be formed as shown in FIG. 7(c). However, in actual small lens processing, it is not easy to form the honeycomb shape shown in FIG. 7(c), and therefore the small lenses are practically formed in a square shape as shown in FIG. 7(a).

When white light is emitted onto the screen after the projector is formed with the remaining configuration shown in FIG. 5 without using the first beam shaper 31, white light having a slight magenta tint in the vertical direction and a cyan tint in the vertical direction is produced.

Figure 8:
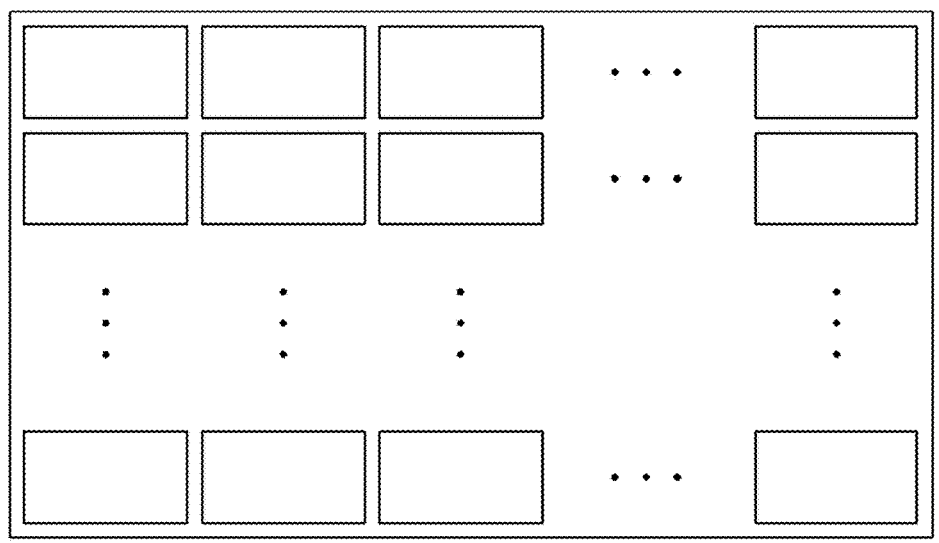
FIG. 8 is an exemplary diagram of a second beam shaper according to an embodiment of the present invention.

The light formed by the first beam shaper 31 is refracted by the reflector 51 and then incident on the second beam shaper 33. A typical example of the second beam shaper 33 may be a fly-eye lens. As described above, the fly-eye lens is realized by multiple small lens bodies. When the second beam shaper 31 is implemented by a fly-eye lens, the small lens bodies are formed in the same shape as that of the optical modulator (more precisely, the shape of the effective screen on the incidence side of the optical modulator). For example, if the effective screen shape of the optical modulator is a quadrangle with an aspect ratio of 16:9, the small lens bodies may also be formed in a quadrangular shape having an aspect ratio of 16:9, thereby minimizing optical loss. FIG. 8 shows an example of the second beam shaper 33 according to an embodiment of the present invention. It can be seen that the second beam shaper 33 is constituted by a plurality of small rectangle-shaped lenses having an aspect ratio of 16:9.

The second beam shaper 33 according to the present invention is designed to vibrate in the vertical direction (substantially in the direction along the long side on the basis of the 16:9 aspect ratio) in FIG. 5 in order to eliminate speckle. Forceps 57 are provided on one surface of the second beam shaper 33 and an oscillator 55 is provided on the other side of the forceps 57. The oscillator 55 can be implemented as a miniature motor and, for ease of implementation, a modified speaker may be used. The speaker includes a fixed permanent magnet, a coil moving according to an applied current frequency, and a diaphragm attached to the moving coil. The other side of the forceps 57 only needs to be attached and fixed to the diaphragm. When power is applied to the coil, the diaphragm oscillates, and accordingly the forceps 57 and the second beam shaper 33 vibrate together.

As a signal for applying vibration to the second beam shaper 33, the ON control signal of the R laser diode 10R can be used. Although not shown in the figure, since a timing control signal transmitted from the outside contains a signal for on/off control of the R laser diode 10R, this signal may be used as a control signal to vibrate the second beam shaper 33. Of course, ON control signals for the other color laser diodes can be used.

According to an experiment, a range of 110 Hz to 240 Hz is suitable as the frequency of vibrating the second beam shaper 33, while frequencies higher than 400 Hz cause noise and thus cannot be used.

The field lens serves to focus the light formed by the second beam shaper 33 on the polarized beam splitter 80. In usual cases, the field lens consists of one to three lenses. In the example shown in FIG. 5, two lenses of the first field lens 41 and the second field lens 43 are provided. By adjusting the distance between these lenses and the second beam shaper 33, accurate focusing can be achieved.

The optical modulator 60 refers to a device that selectively transmits or blocks incident light or changes an optical path to generate an image. Typical examples of the optical modulator 60 may include a digital micromirror device (DMD), a liquid crystal display device (LCD) and an LCoS.

The present invention is limited to a liquid crystal optical modulator using a liquid crystal device such as an LCD or an LCoS. The LCD is a device that selectively turns on/off liquid crystals to generate an image. Projectors using the LCD include a direct type projector, a projection type projector, and a reflective projector. The direct type projector causes light from the backlight behind the LCD to pass through the liquid crystal panel such that a generated image is directly viewed. The projection type projector enlarges an image generated when light passes through the LCD by using a projection lens and then projects the enlarged image onto a screen such that the image reflected onto the screen is viewed. The reflective projector has almost the same structure as the projection type projector, except that a reflective film is formed on a lower substrate such that light is reflected and projected onto the screen with the image enlarged. LCoS (Liquid Crystal on Silicon) is a reflective liquid crystal display, which is a reflective optical device that operates using a silicon substrate employed in place of transparent glass, which is conventionally used as the lower substrate of the two substrates of an LCD.

The diffuser 20 is an optical device for increasing randomness of light. The diffuser, which is a device for removing speckles unique to a laser beam, lowers coherence of the laser beam to reduce speckles. On the other hand, the diffuser 20 also has a side effect of deteriorating optical values (e.g., F#) designed to be achieved by a light source, a beam shaper, and a group of lenses such as field lenses. That is, the optical characteristics defined by the other lens groups are disturbed. The effect of reducing the speckles obtained by the diffuser 20 is enhanced the closer the diffuser 20 is installed to the polarized beam splitter 80. Further, a diffusion sheet constituting the diffuser 20 has a unique light absorption rate and has a disadvantage of absorbing a considerable amount of light. Generally, the diffusion sheet constituting the diffuser has a transmittance of about 80% to 90%. Furthermore, since the diffusion sheet is made by expanding the sheet in a certain direction during the manufacturing process, the diffusion sheet has directionality in a certain direction, thereby partially affecting the polarization direction. The diffusion sheet has a very negative effect on luminous efficacy when an LCD is used as an optical modulator.

The polarized beam splitter 80 is an optical device that uses a polarization splitting film to allow P-polarized light to pass therethrough and reflect S-polarized light in a direction opposite to the projection lens. Alternatively, the polarized beam splitter may be configured to pass S-polarized light and to reflect P-polarized light, if necessary. In the present invention, for simplicity, the polarized beam splitter is illustrated as passing S-polarized light and reflecting P-polarized light.

The S-polarized light incident on the polarized beam splitter 80 is reflected toward the optical modulator 60, and then the image light converted into P-polarized light is again incident on the polarized beam splitter 80, and reaches the polarization splitting film. Since all the image light is S-polarized light at this time, it is transmitted through the polarization splitting film and incident on the projection lens 70. The projection lens 70 is formed using a plurality of lenses, and enlarges and projects an image formed by the optical modulator 60 onto a screen (not shown).

Figure 9:
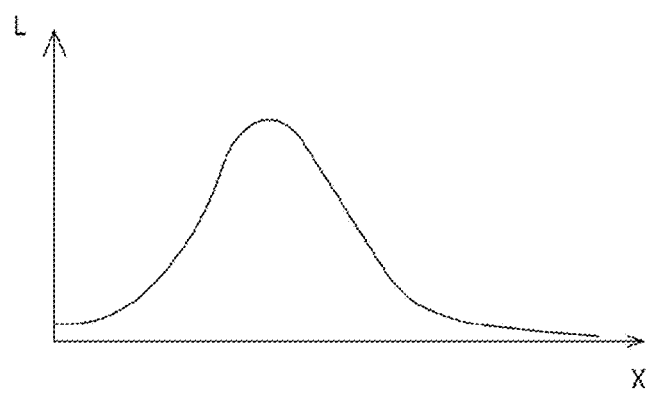
FIG. 9 illustrates a Gaussian distribution for operation of a diffuser and an effect which is changed when the diffuser is vibrated.
Figure 9:
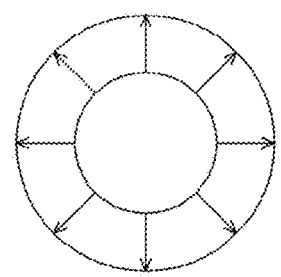

In order to eliminate speckle, Patent Document 1 adopts a system in which the diffuser is vibrated and the reflection surface formed on the reflector is inclined. When light is incident on a diffuser placed in a non-oscillating state, the emitted light has a Gaussian distribution in which light is concentrated at the central portion and the surrounding portion is darkened. FIG. 9 illustrates a Gaussian distribution for operation of a diffuser and an effect which is changed when the diffuser is vibrated. In FIG. 9A, the horizontal axis x indicates the distance between the light travel direction and the vertical direction, and the vertical axis L indicates luminance. As shown in FIG. 9($a$), light is concentrated at the center of the diffuser and brightness is increased from the periphery to the center. FIG. 9 ($b$) is an exemplary diagram illustrating an effect obtained by vibrating the diffuser. The inner circle represents a region exhibiting luminance greater than or equal to a certain degree when the diffuser is not vibrated and the outer circle indicates expansion of the region exhibiting luminance greater than or equal to the certain degree when the diffuser is vibrated. In other words, when the diffuser is vibrated, the incident light spreads further toward the outer periphery, but concentration of the light at the center is maintained. Therefore, when the diffuser is vibrated, speckle generated by the light passing through the central portion can be reduced considerably. However, due to the Gaussian distribution, influence on the light passing through the outer region is lowered, and therefore speckles produced in the outer region cannot be significantly affected.

However, when the second beam shaper 33 is vibrated as proposed in the present invention, light transmitted through the entire area of the second beam shaper 33 is uniformly affected since a plurality of the small lens bodies 37 is uniformly disposed on the second beam shaper 33. Accordingly, speckles may be reduced.

Although the embodiment using the liquid crystal optical modulator formed of the reflective LCD has been described so far, the present invention can be implemented in the liquid crystal optical modulator using a transmissive LCD. When a transmissive liquid crystal optical modulator is used, the structure of the optical device may be simplified by using an optical device called an X-Cube in place of a beam splitter.

Figure 10:
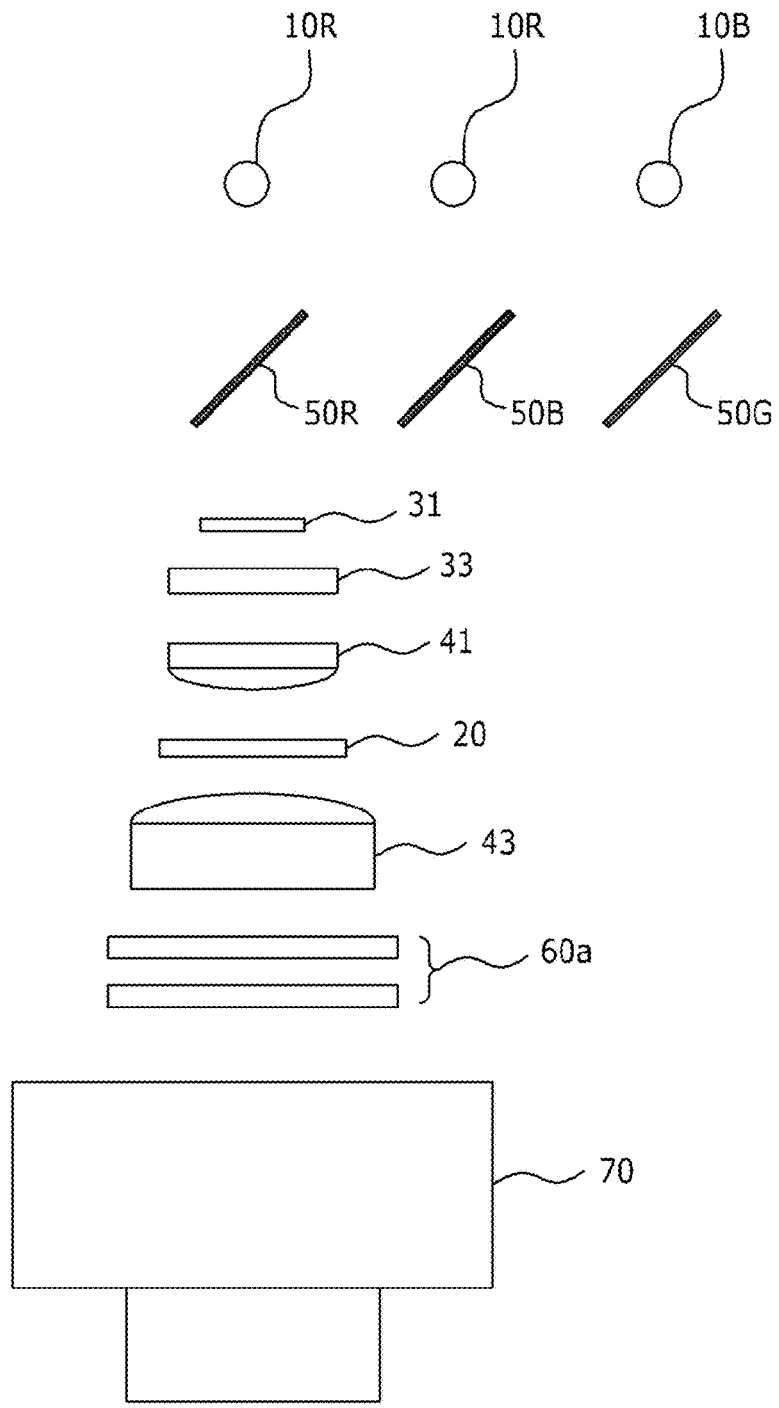
FIG. 10 is a configuration diagram illustrating a liquid crystal projector implemented using a transmissive liquid crystal optical modulator according to an embodiment of the present invention.

FIG. 10 is a configuration diagram illustrating a liquid crystal projector implemented using a transmissive liquid crystal optical modulator according to an embodiment of the present invention. The reference numerals used in FIG. 5 are the same as those shown in FIG. 5. For the liquid crystal projector shown in FIG. 10, a beam splitter is not used, and accordingly the optical device is simplified. In FIG. 10, the second beam shaper 33, which can be vibrated, is omitted for simplicity. The liquid crystal optical modulator 60 shown in FIG. 5 is a reflective optical modulator, whereas the liquid crystal projector shown in FIG. 10 employs a transmissive liquid crystal optical modulator 60$a$.

Figure 11:
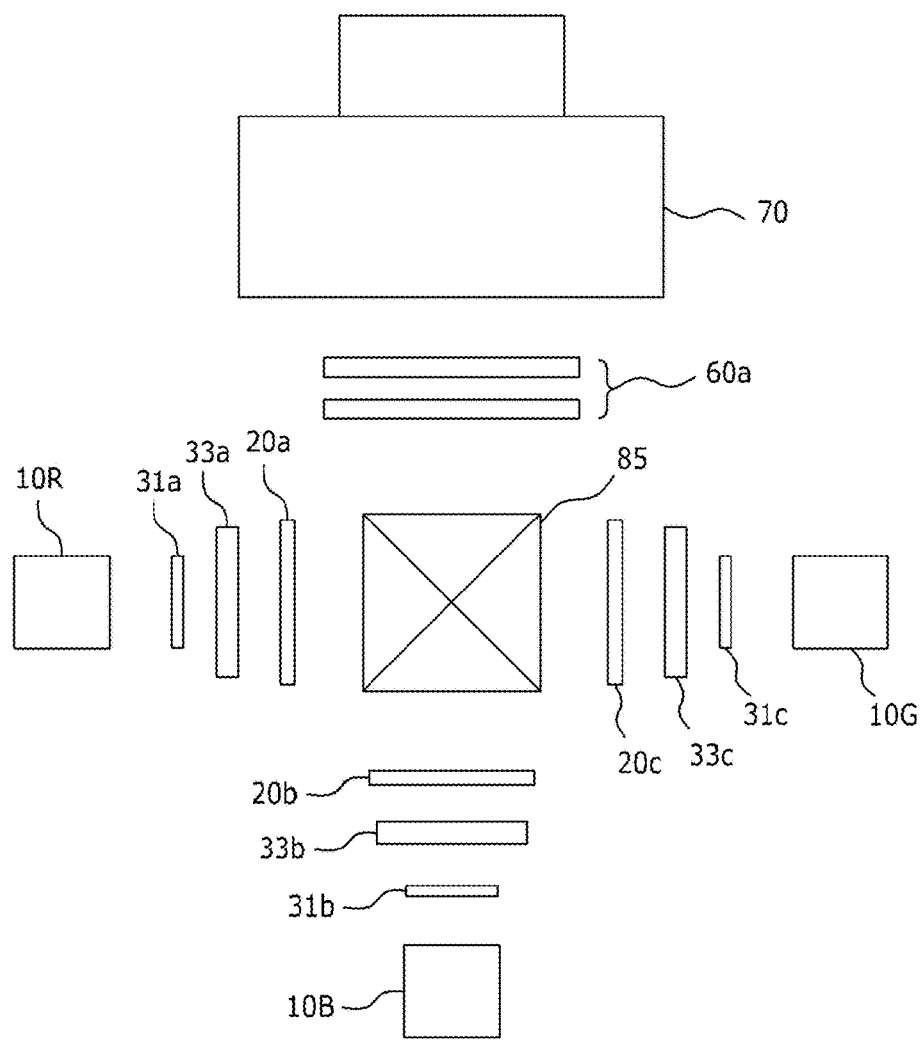
FIG. 11 is a configuration diagram illustrating a liquid crystal projector implemented using a transmissive liquid crystal optical modulator according to an embodiment of the present invention.

FIG. 11 is a configuration diagram illustrating a liquid crystal projector implemented using a transmissive liquid crystal optical modulator according to an embodiment of the present invention. An X-Cube 85 is disposed at the center to reflect output light of the R, B, and G laser diodes emitted from the left side, the lower side, and the right side in the upward direction. In the example of FIG. 11, a first beam shaper 31$a$, 31$b$, 31$c$, a second beam shaper 33$a$, 33$b$, 33$c$, and a diffuser 20$a$, 20$b$, 20$c$ are provided between the laser diode 10R, 10B, 10G of each color and the X-Cube 85.

The liquid crystal projector shown in FIGS. 10 and 11 has an advantage in that the optical device can be compact compared to the liquid crystal projector shown in FIG. 5, but the light transmission efficiency thereof is lower than that of the reflective liquid crystal optical modulator due to the characteristics of the transmissive liquid crystal optical modulator.

In particular, the liquid crystal projector shown in FIG. does not need to drive the laser diodes in a time-division manner, but, in order to realize a small projector that provides high luminance, it is preferable to construct the projector using intrinsic multimode laser diodes having a watt class output power.

Hereinafter, the projection lens will be described. Table shows the design data of the projection lens of the present invention.

TABLE 1

| Lens | Surface | Radius of curvature | Thickness | Refractive index | Abbe's number | Focal length | Refractive power ($|Kn/Kt|$) |
|---|---|---|---|---|---|---|---|
| First lens | First surface | −33.5 | 1.9 | 1.51 | 64 | −16 | 0.72675 |
|  | Second surface |  | 3.5 |  |  |  |  |
| Second lens | First surface | −7.8 | 4 | 1.51 | 64 | 11 | 1.057091 |
|  | Second surface | −32.7 |  |  |  |  |  |
| Third lens | First surface | 3.8 | 1.9 | 1.48 | 70 | 13 | 0.894462 |
|  | Second surface | −32.7 |  |  |  |  |  |
| Fourth lens | First surface | 5.6 | 5.1 | 1.77 | 49 | 13 | 0.894462 |
|  | Second surface | 20.32 |  |  |  |  |  |
| Fifth lens | First surface | 9.4 | 4.9 | 1.51 | 64 | 11.8 | 0.985424 |
|  | Second surface | −15.5 |  |  |  |  |  |

The F number of the projection lens is 4.0, the total focal length is 11.628 mm, the total tract length (TTL) is mm, and the angle of view is 58°. The lenses are numbered in order from the external air to the polarized beam splitter (PBS). Therefore, the lens closest to the external air becomes the first lens, and the lens closest to the polarized beam splitter becomes the fifth lens.

The depth of field (DoF) is the distance between the nearest and farthest objects in a scene that appears acceptably sharp in an image. A large DoF is often called deep focus, and a small DoF is often called shallow focus.

As the F number increases, the DoF becomes large, and accordingly the range within which a clear image can be maintained without adjusting the focus of the projection lens can be increased. However, increasing the F number is accompanied by reduction in efficiency, and also causes the speckle noise unique to the laser to increase. Therefore, the F number cannot be increased indefinitely. In this invention, the F number is set to between 3.2 and 5.0. Preferably, the F number is set to 4.0.

The first glass lens L1 has the longest focal length and the second plastic lens has the shortest focal length. Therefore, the refractive power of the first glass lens is the lowest, and the refractive power of the second plastic lens is the highest. The refractive power is the reciprocal of the focal length.

$|Kn/Kt|$ is the absolute value of the refractive power of each lens divided by the refractive power of all lenses, and represents the ratio of the refractive power of each lens to the refractive power of all lenses.

Since the first glass lens is a lens which is arranged on the outermost side of the projection lens and directly contacts the external air, it can contact organic matter on a human hand. Since the first glass lens needs to block a direct influence of the external temperature change, it is made of FC5_HOYA glass and the refractive power assigned thereto is not high.

The refractive power of the first glass lens is set to satisfy Equation 1.

$$0.5 < |K1/Kt| < 0.9 \quad \text{Equation 1}$$

The projection lens consists of five lenses. Among the five lenses, three lenses are aspheric lenses formed of plastic, and the other two lenses are formed of glass. The fourth lens is formed of BACD16_HOYA glass. The fourth lens has a high refractive power and serves as the main lens of the projection lens. The second, third and fifth lenses are aspheric lenses, which can reduce the overall size while maintaining the performance of the projection lens.

The second, third, and fifth plastic lenses have aspheric surfaces on both sides. The aspheric shape of a lens is represented by a conic constant and an aspheric coefficient. The conic constants and the aspheric coefficients of the second, third, and fifth lenses are shown in Table 2.

TABLE 2

|  | Second lens | | Third lens | | Fifth lens | |
|---|---|---|---|---|---|---|
|  | First surface | Second surface | First surface | Second surface | First surface | Second surface |
| K | 0.00000000 | 12.10000000 | 0.36000000 | −10.60000000 | 11.30000000 | 60.10000000 |
| A | 0.00001020 | 0.00000301 | 0.00001020 | 0.00009530 | 0.00003650 | 0.00009850 |
| B | −0.00020300 | −0.00003690 | −0.00020300 | −0.00022698 | −0.00098030 | −0.00055600 |
| C | 0.00000336 | 0.00003335 | 0.00000336 | 0.00000450 | 0.00000665 | 0.00000753 |
| D | −0.00000198 | −0.00000555 | −0.00000136 | −0.00000300 | −0.00000879 | −0.00000678 |

The aspheric shape is obtained by estimating the Z value with change of the Y value in the following equation, and is usually processed by a computer. The aspheric shape can be drawn when the Z value is plotted according to change of the Y value. Therefore, in the related industry, if only the conic constant and the aspheric coefficient are defined, it is possible to make the curved surface of the lens different from the spherical surface.

The details relating to the aspheric surface used in the embodiment of the present invention are defined by Equation 2.

$$Z = \frac{CY^2}{1 + \sqrt{1 - (1+K)c^2Y^2}} + AY^4 + BY^6 + CY^8 + DY^{10} + EY^{12} + FY^{14} + \ldots,$$

Equation 2 where Z: the distance from the apex of the lens in the direction of the optical axis, Y: the vertical distance from the optical axis, C: the reciprocal of the radius of curvature r at the apex of the lens, K: Conic constant A, B, C, D, E, and F: Aspheric coefficients The optical engine can be broadly divided into an illumination system and an imaging system.

The illumination system refers to an engine that illuminates the active area of an imager to create an image after a light beam emitted from a light source is formed so as to be aligned with the active area of an optical modulator. The imaging system refers to an engine that enlarges and projects the image created by the optical modulator on the screen such that the image is focused on the screen.

The most important part of the imaging system is the projection lens, which plays a very important role in determining the quality of the projector. The projection lens according to the present invention has a resolution of 1280×720, a Modulation Transfer Function (MTF) suitable for a pixel size of 6.4 μm, a uniformity of 80% or more, and optical distortion of 1% or less, and should maintain a large F number at an angle of view of 58°.

To manufacture a projection lens having this function with only spherical lenses, it will take about 8 or more spherical lenses and the size of the projection lens will be twice the size of 24 mm. To reduce the size and number of lenses, it is necessary to use an aspheric lens. Accordingly, in an embodiment, only two spherical glass lenses are used and three aspheric plastic lenses are used to achieve the above specifications. It is not easy to configure the projection lens to be small and to increase the angle of view while achieving the above resolution and uniformity.

In the present invention, the maximum theoretical angle of view that can be achieved while satisfying the above conditions is about 60 degrees, and it is designed to be 58 degrees in consideration of mass productivity. As the projection has a large F number, it has a large DoF. The projection lens is designed to have optimum focus at a distance of 1 m (screen size of about 33"). In reality, sharp images can be obtained from a distance between 20" to 80" without focusing adjustment.

In describing the embodiments of the present invention, detailed description of known functions and configurations incorporated herein have been omitted when it may make the subject matter of the present disclosure rather unclear.

Terms including ordinal numbers such as first, second, etc. may be used to explain various components, but the constituents are not limited thereto. These terms are used only for the purpose of distinguishing one constituent from another. For example, without departing from the scope of the present invention, a first component may be referred to as a second component, and similarly, the second component may also be referred to as a first component. The term "and/or" includes any combination of a plurality of related listed items or any of a plurality of related listed items.

When one constituent is mentioned as being "connected" or "linked" to another, it should be understood that this means the one constituent may be directly connected or linked to the other one or another constituent may be interposed between the constituents. On the other hand, when one constituent is mentioned as being "directly connected" or "directly linked" to another, it should be understood that this means no other constituent is interposed between the constituents.

Terms used in this specification are merely adopted to explain specific embodiments, and are not intended to limit the present invention. A singular expression includes a plural expression unless the two expressions are contextually different from each other. In this specification, a term "include" or "have" is intended to indicate that characteristics, figures, steps, operations, constituents, and components disclosed in the specification or combinations thereof exist. The term "include" or "have" should be understood as not pre-excluding possibility of existence or addition of one or more other characteristics, figures, steps, operations, constituents, components, or combinations thereof.

In addition, the constituent elements in the embodiments of the present invention are shown independently to represent different characteristic functions, and do not mean that each constituent element is configured as separate a hardware item or one software constituent unit. That is, each constituent part is listed and included as a constituent unit for convenience of explanation, and at least two of the constituent parts may be combined to form one constituent part, or one constituent part may be divided into a plurality of constituent parts to perform a function. The embodiment of the integrated parts and embodiment of separated parts are also within the scope of the present invention, unless they depart from the essence of the present invention.

Unless otherwise defined, all terms, including technical and scientific terms, have the same meaning as commonly understood by one of ordinary skill in the art to which this invention pertains, unless otherwise defined. Commonly used terms, such as those defined in typical dictionaries, should be interpreted as being consistent with the contextual meaning of the relevant art, and are not to be construed in an ideal or overly formal sense unless expressly defined to the contrary.

The invention claimed is:

1. A laser-diode, liquid-crystal projector using a laser diode as a light source and a liquid crystal element as an optical modulator, wherein the light source includes: a G laser diode for emitting green light of an elliptical shape elongated in a first direction; a B laser diode for emitting blue light of an elliptical shape elongated in the first direction, an R laser diode for emitting red light of an elliptical shape elongated in a direction parallel to the first direction, the R laser diode being disposed such that a power application pin thereof is arranged parallel to an installation direction of a power application pin of the G laser diode or the B laser diode, the laser-diode, liquid-crystal projector comprising:
a first beam shaper for transforming light emitted from the light source in a perpendicularly intersecting pattern into uniform light;
a second beam shaper for forming the light emitted from the first beam shaper into a shape of an effective surface of the optical modulator;
a field lens for condensing the light formed by the second beam shaper;
a polarized beam splitter for reflecting the light incident from the field lens to the optical modulator and allowing an image incident from the optical modulator to be transmitted therethrough;
a projection lens for enlarging and projecting the image;
forceps coupled with one side of the second beam shaper; and
an oscillator coupled with an opposite side of the forceps,
wherein the G laser diode, the B laser diode, and the R laser diode are intrinsic multimode laser diodes,
wherein light rays emitted from the G laser diode, the B laser diode, and the R laser diode configured to form light in a perpendicularly crossing shape have the same polarization axis,
wherein the G laser diode, the B laser diode, and the R laser diode are watt class diodes for outputting light at an output power of one watt or more.

2. The laser-diode, liquid-crystal projector according to claim 1, further comprising:
a diffuser provided between the second beam shaper and the polarized beam splitter to increase randomness of incident light.

3. The laser-diode, liquid-crystal projector according to claim 2, wherein the first lens among the lenses constituting the projection lens is formed of glass and satisfies the following equation:

$$10.5<|K1/KT|<0.9,$$

where K1 denotes an index of refraction of the first lens, and Kt is an index of refraction of the projection lens.

4. The laser-diode, liquid-crystal projector according to claim 1, wherein the first beam shaper is provided with a fly-eye lens comprising a plurality of small lens bodies, the small lens bodies having one shape selected from among a square, a circle, and a regular octagon.

5. The laser-diode, liquid-crystal projector according to claim 4, wherein the first lens among the lenses constituting the projection lens is formed of glass and satisfies the following equation:

$$10.5<|K1/KT|<0.9,$$

where K1 denotes an index of refraction of the first lens, and Kt is an index of refraction of the projection lens.

6. The projector according to claim 1, wherein the Oscillator vibrates according to an ON control signal of one laser diode selected from among the R laser diode, the G laser diode, and the B laser diode.

7. The laser-diode, liquid-crystal projector according to claim 6, wherein the first lens among the lenses constituting the projection lens is formed of glass and satisfies the following equation:

$$10.5<|K1/KT|<0.9,$$

where K1 denotes an index of refraction of the first lens, and Kt is an index of refraction of the projection lens.

8. The laser-diode, liquid-crystal projector according to claim 1, wherein the projection lens comprises three aspheric lenses and two spherical lenses, the lenses being defined as a first lens, a second lens, a third lens, a fourth lens, and a fifth lens in order of closeness to external air.

9. The laser-diode, liquid-crystal projector according to claim 8, wherein the second lens, the third lens, and the fifth lens are plastic double-sided aspheric lenses.

10. The laser-diode, liquid-crystal projector according to claim 8, wherein the first lens among the lenses constituting the projection lens is formed of glass and satisfies the following equation:

$$10.5<|K1/KT|<0.9,$$

where K1 denotes an index of refraction of the first lens, and Kt is an index of refraction of the projection lens.

11. The laser-diode, liquid-crystal projector according to claim 1, wherein the first lens among the lenses constituting the projection lens is formed of glass and satisfies the following equation:

$$10.5<|K1/KT|<0.9,$$

where K1 denotes an index of refraction of the first lens, and Kt is an index of refraction of the projection lens.

12. The laser-diode, liquid-crystal projector according to claim 1, wherein an F number of the projection lens is between 3.2 and 5.0.

13. The laser-diode, liquid-crystal projector according to claim 1, wherein the first lens among the lenses constituting the projection lens is formed of glass and satisfies the following equation:

$$10.5<|K1/KT|<0.9,$$

where K1 denotes an index of refraction of the first lens, and Kt is an index of refraction of the projection lens.

14. The laser-diode, liquid-crystal projector according to claim 1, wherein the first lens among the lenses constituting the projection lens is formed of glass and satisfies the following equation:

$$10.5<|K1/KT|<0.9,$$

where K1 denotes an index of refraction of the first lens, and Kt is an index of refraction of the projection lens.

* * * * *